(12) United States Patent
Stahr et al.

(10) Patent No.: US 9,418,930 B2
(45) Date of Patent: Aug. 16, 2016

(54) POWER MODULE

(71) Applicant: AT&S Austria Technologie & Systemtechnik Aktiengesellschaft, Leoben (AT)

(72) Inventors: Johannes Stahr, St. Lorenzen (AT); Andreas Zluc, Leoben (AT); Gernot Grober, Graz (AT); Timo Schwarz, St. Michael i.O. (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 14/897,217

(22) PCT Filed: May 6, 2014

(86) PCT No.: PCT/AT2014/050113
§ 371 (c)(1),
(2) Date: Dec. 9, 2015

(87) PCT Pub. No.: WO2014/197917
PCT Pub. Date: Dec. 18, 2014

(65) Prior Publication Data
US 2016/0133558 A1    May 12, 2016

(30) Foreign Application Priority Data
Jun. 11, 2013    (AT) .............................. A 50382/2013

(51) Int. Cl.
*H01L 23/36* (2006.01)
*H01L 23/498* (2006.01)
(Continued)

(52) U.S. Cl.
CPC ...... *H01L 23/49838* (2013.01); *H01L 23/3121* (2013.01); *H01L 23/36* (2013.01);
(Continued)

(58) Field of Classification Search
CPC ... H01L 23/36; H01L 23/367; H01L 23/3735; H01L 23/5385; H01L 23/5389; H01L 23/49833; H01L 23/49838; H01L 2924/00; H01L 2924/0002
USPC ........................................................ 257/692
See application file for complete search history.

(56) References Cited

U.S. PATENT DOCUMENTS 6,442,033 B1 * 8/2002 Liu ..................... H01L 21/563
174/538

FOREIGN PATENT DOCUMENTS

| EP | 275433 A1 | 7/1988 |
| GB | 2485087 A | 5/2012 |
| WO | 2014197917 A1 | 12/2014 |

OTHER PUBLICATIONS

Pang et al., "Assessment of Some Integrated Cooling Mechanisms for an Active Integrated Power Electronics Module", Journal of Electronic Packaging, ASME International, US, vol. 129, No. 1, Mar. 2007, pp. 1-8.*

(Continued)

*Primary Examiner* — Kenneth Parker
*Assistant Examiner* — Young W Kim
(74) *Attorney, Agent, or Firm* — KPPB LLP

(57) ABSTRACT

A power module, having a printed circuit board core, which contains at least one electronic power component embedded in an insulating layer, the core being arranged between two heat dissipation plates, wherein each heat dissipation plate has a metal outer layer and a metal inner layer electrically separated from said metal outer layer by a thermally conductive, electrically insulating intermediate layer, and electrode terminals of the at least one power component are guided out from the core via terminal lines, wherein the printed circuit board core on both sides of the insulating layer has a conductor layer, at least one conductor layer is structured at least in portions, and each conductor layer is connected at least in portions via a conductive, metal intermediate layer to a metal inner layer of the heat dissipation plate, contacts run from the structured conductor layer to the electrode terminals of the at least one power component, and at least one power terminal of the at least one power component is connected via a contact, a portion of a structured conductor layer, and the conductive, metal intermediate layer to at least one portion of the metal inner layer of the heat dissipation plate, which forms part of the terminal line to the electrode terminal.

9 Claims, 5 Drawing Sheets

(51) Int. Cl.
 H01L 23/373 (2006.01)
 H01L 23/31 (2006.01)
 H01L 23/367 (2006.01)
 H01L 23/538 (2006.01)
(52) U.S. Cl.
 CPC ......... H01L 23/367 (2013.01); H01L 23/3735 (2013.01); H01L 23/5389 (2013.01); H01L 23/49833 (2013.01); H01L 23/5385 (2013.01); H01L 2924/0002 (2013.01)

(56) References Cited

OTHER PUBLICATIONS

International Preliminary Report on Patentability for International Application PCT/AT2014/050113, Report issued Aug. 28, 2015, Mailed Aug. 28, 2015, 14 Pgs.
International Search Report for International Application PCT/AT2014/050113, Report completed Aug. 22, 2014, Mailed Aug. 28, 2014, 3 Pgs.
Charboneau, B C et al., "Double-Sided Liquid Cooling for Power Semiconductor Devices Using Embedded Power Packaging", IEEE Transactions on Industry Applications, IEEE Service Center, vol. 44, No. 5, Sep. 1, 2008, pp. 1645-1655, XP011446042, ISSN: 0093-994, DOI: 10.1109/TIA.2008.2002270.
Jian, Yin, "High Temperature SiC Embedded Chip Module (ECM) with Double-sided Metallization Structure", Jan. 3, 2006, XP055135318, Retrieved from Internet: URL:http://hdl.handle.net/10919/30076.
Mital et al., "Thermal Design Methodology for an Embedded Power Electronic Module Using Double-Sided Microchannel Cooling", Journal of Electric Packaging, ASME International, US, vol. 130, No. 3, Sep. 1, 2008, XP008171354, DOI: 10.1115/1.2957320, Retrieved on Jul. 29, 2008.
Pang, Y. et al., "Assessment of Some Integrated Cooling Mechanisms for an Active Integrated Power Electronics Module", Journal of Electronic Packaging, ASME International, US, vol. 129, No. 1, Mar. 1, 2007, pp. 1-8, XP008171355, ISSN: 1 043-7398, DOI: 1 0.1115/1.2429703.

* cited by examiner

POWER MODULE

CROSS REFERENCE TO RELATED APPLICATIONS

This application is a national stage of PCT Application No. PCT/AT2014/050113 filed May 6, 2014, which application claims priority to Austrian Application No. A 50382/2013 filed on Jun. 11, 2013, the disclosures of which are hereby incorporated by reference in their entireties.

BACKGROUND OF THE INVENTION

1. Subject of the Invention

The invention relates to a power module, having a printed circuit board core which contains at least one electronic power component embedded in an insulating layer, the core being arranged between two heat dissipation plates, wherein each heat dissipation plate has a metal outer layer and a metal inner layer electrically separated from said metal outer layer by a thermally conductive, electrically insulating intermediate layer, and electrode terminals of the at least one power component are guided out from the core via terminal lines.

2. Prior Art

In the case of power modules, which for example include IGBTs together with freewheeling diodes and which are intended to process high currents and voltages, which for example in the automotive field in the case of DC/AC converters in the case of electric drives lie in the region of 500 volts and 200 amperes and also thereabove, there is a need to keep the thermal resistance as low as possible, wherein the terminal lines are to be designed for high currents with very low inductance. When constructing modules of this type, what is known as "wire-bond" technology with Al wires and soldered connections is currently predominantly used. The individual components, such as IGBTs and diodes, are arranged here are on special substrates, for example DBC=direct bond copper technology), which for example consist of two copper layers, which are separated by a ceramic layer, such as $Al_2O_3$.

In order to meet the electrical and thermal requirements, the guidance of the terminal lines must be complex, wherein for example thick aluminium wires are used for the connection of gate and source contacts, arranged at the top, of IGBTs, however these wires, on account of their high coefficient of thermal expansion, tend to detach or rupture on account of what are known as "heel cracks" at bends. In the case of such arrangements the drain contacts of an IGBT, which are arranged on the opposite side, are soldered onto the substrate or are connected by press sintering. This substrate (DCB) is soldered onto a thick aluminium plate, which is arranged on a heat dissipation plate via a thermally conductive interface material. It has been demonstrated, however, that faults occur with relatively long periods of operation and are to be attributed to cycles of the performance and thermal stress and resultant different expansions of the components and cracks and material fatigue and manifest themselves for example in a detachment of the aluminium wires or in breaks of the chip or substrate.

The previously preferably used embeddings of power semiconductors are also characterised by a high self inductance of the wire connections, which leads to power losses and high heating, and by the use of costly substrates for the electrical insulation and heat transfer. In order to improve the efficiency of the cooling, solutions have also been created which provide double-sided cooling. Examples of such known power modules are presented and described inter alia in U.S. Pat. No. 8,102,047 B2, U.S. Pat. No. 7,514,636 B2 or U.S. Pat. No. 8,358,000 B2.

A power module of the type mentioned in the introduction is known for example from the article "High Power IGBT Modules Using Flip Chip Technology", IEEE Transactions on Components and Packaging Technology, Vol. 24, No. 4, December 2001. In the case of this module, double-sided cooling is likewise provided, wherein power components, here two IGBTs and four diodes, are embedded between two DBC layers, which are in turn soldered onto heat sinks. The DBC substrate of the two layers consists of an $Al_2O_3$ layer 0.63 mm thick, which is covered on both sides by copper layers 0.3 mm thick. The drain contact of the IGBTs and the cathode terminals of the diodes are soldered by means of a tin/lead/silver solder to the lower DBC layer, and the source and the gate contacts of the IGBTs and the anode contacts of the diodes are soldered using the same solder to the upper DBC layer, wherein a flip-chip bonding technique is used. The terminal lines to the source and the gate contacts of the IGBTs and the anode contacts of the diodes are guided in the structured thin inner copper layer of the upper DBC layer. Although double-sided cooling is applied here, the problem of high-current lines to the power terminals (source of the IGBTs, anodes of the diodes), primarily in view of the self-inductances, remains unsolved.

It should be noted at this juncture that the terms "top" and "bottom" relate to the representations used conventionally, but do not specify the actual usage position of the modules. Furthermore, the power components under consideration here are primarily power semiconductors, such as IGBTs and freewheeling diodes, however this is not intended to be limiting, since either active or passive electronic/electrical components may also be part of the module.

The object of the invention lies in creating a power module of the type in question, in which the problem of heat dissipation or heat generation by line inductances in the case of power components embedded in a module is overcome economically.

SUMMARY OF THE INVENTION

Proceeding from a power module of the type described in the introduction, the invention solves the stated problems in that the printed circuit board core on both sides of the insulating layer has a conductor layer, at least one conductor layer is structured at least in portions, and each conductor layer is connected at least in portions via a conductive, metal intermediate layer to a metal inner layer of the heat dissipation plate, plated through-holes run from the structured conductor layer to the electrode terminals of the at least one power component, and at least one power terminal of the at least one power component is connected via a plated through-hole, a portion of the structured conductor layer, and the conductive, metal intermediate layer to at least one portion of the metal inner layer of the heat dissipation plate, which forms part of the terminal line to the electrode terminal.

Power modules according to the invention can process high currents and powers, wherein they are characterised by low weight and small dimensions. An important field of use is constituted for example by voltage converters in electric vehicles, specifically both in hybrid vehicles and in pure electric vehicles.

It is advantageous when at least the metal inner layers of the heat dissipation plates consist of copper, since copper is a proven material in view of the formation of conductive tracks and in view of its thermal conductivity.

An expediently producible electrical connection is obtained when at least one terminal of a power component is connected via a conductor layer and a conductive metal intermediate layer to the metal inner layer of a heat dissipation plate.

In particular in order to compensate for uneven heights of the components, it is advisable for at least one terminal of a power component to be connected to a conductor layer via a current-conducting and thermally conductive metal block. Here, it is advantageous from a manufacturing point of view if a terminal is connected to a conductor layer via a metal intermediate layer.

In the sense of an improvement of the thermal and electrical load-bearing capability, it may be that the printed circuit board core has at least one metal block, which is thermally and/or electrically connected at least to portions of the upper and lower conductor layer. Here, it is advisable for the at least one metal block to consist of copper.

An advantageous unbundling of power and control lines is provided when the module contains at least one IGBT chip/MOSFET, of which the source and drain terminals are connected to the metal inner layer, whereas the gate terminal is guided out from the module via a conductive track.

In an advantageous development of the power module according to the invention, this contains at least one power diode, of which the cathode and anode are connected to the metal inner layer.

In an expedient development of the invention, the metal intermediate layer consists of a low-temperature silver sintering material.

BRIEF DESCRIPTION OF THE DRAWINGS

The invention and also further advantages is explained in greater detail hereinafter on the basis of exemplary embodiments, which are illustrated in the drawing, in which.

DESCRIPTION OF PREFERRED EMBODIMENTS

Figure 1:
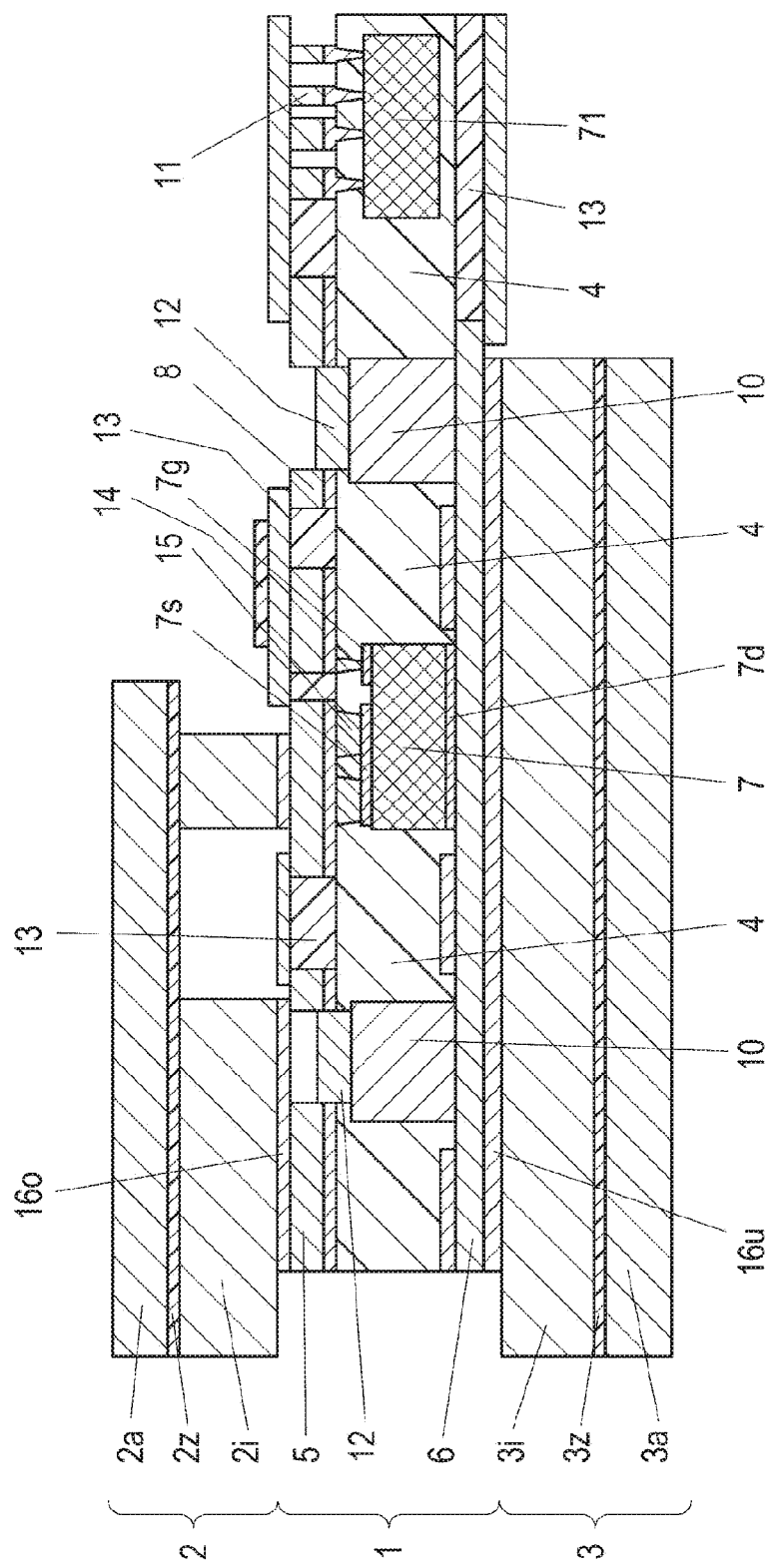
FIG. 1 shows a section through a first embodiment of the invention.

FIG. 1 shows, partly schematically, a first embodiment of a power module according to the invention, which has a printed circuit board core 1 arranged between two heat dissipation plates 2 and 3. The printed circuit board core 1 consists, as is the case with a conventional two-sided printed circuit board, of an insulating layer 4, for example a prepreg, which is conventional in printed circuit board construction and which on both sides has a conductor layer, specifically a copper layer. Here, the upper conductor layer 5 is structured so as to form conductive tracks 8, however the lower conductor layer 6 does not necessarily have to be structured in the present example. In the present case an IGBT chip 7, an IGBT driver 71, and two copper inlays 10 are embedded in the insulating layer 4.

The IGBT chip 7 has three electrode terminals, specifically a lower drain terminal 7d, an upper source terminal 7s, and an upper gate terminal 7g. The terminals of the IGBT chip 7 are advantageously metallised with copper, wherein the drain terminal 7d is connected to the lower conductor layer 6. This connection can be established either directly (copper-copper) or with use of a solder or a sintering material. Contacts designated generally by the reference sign 11 run from the upper conductor layer 5 to the source terminal 7s or to the gate terminal 7g. It is clear that the connections to the power terminals (drain, source) on the whole have a much larger cross section than the connection to the control terminal (gate). In order to avoid misunderstandings, it should be noted at this juncture that the source and drain of an IGBT transistor are often designated by the terms collector and emitter.

The inputs and outputs (not designated in greater detail) of the IGBT driver 71 are likewise connected via contacts 11, for example made of galvanically applied copper, to the structures of the upper conductor layer 5. The aforementioned copper inlays 10, which on the one hand serve as plated through-holes for the electrical connection of the upper conductor layer 5 to the lower conductor layer 6 and on the other hand serve to improve the heat dissipation and to increase the thermal capacity, in this example sit with their underside on the lower conductor layer 6 and are likewise brought into contact with the upper conductor layer 5 via copper contacts 12.

Gaps in the conductor structures can be filled or covered both on the upper and lower conductor layer 5 and 6 with insulating material 13, such as a prepreg, not least in order to eradicate the risk of dielectric breakdowns or leakage currents. Contacts or tracks may be arranged again on layers of this insulating material, such as the conductive track 14, to which the gate terminal 7g is guided via a contact 15.

The printed circuit board core 1 just described is in thermal and/or electrical contact with the heat dissipation plates 2 and 3, which will be explained hereinafter. Each of the heat dissipation plates 2, 3 has a metal outer layer 2a, 3a and a metal inner layer 2i, 3i separated from said metal outer layer by a thermally conductive, electrically insulating intermediate layer 2z, 3z. In the case of heat dissipation plates of this type, which are also known under the name IMS (insulated metal substrate), the metal inner layer 2i, 3i consists for example of copper having a thickness from 200 to 400 μm, the metal outer layer 2a, 3a consists of aluminium or copper having a thickness from 1 to 2 mm, and the insulating intermediate layer 2z, 3z consists of a polymer material having a high filling degree of particles made of aluminium oxide or aluminium nitride having a thickness of 100 μm. The metal outer layer 2a, 3a may also be provided with channels or structured areas for forced gas or liquid cooling. It goes without saying that the thicknesses of the individual layers may be selected within wide limits in a manner dependent on the respective application and thermal load.

The connection of the printed circuit board core 1 to the heat dissipation plates 2 and 3 is established in each case via a metal intermediate layer 16o and 16u respectively, which in the present case consists of a low-temperature silver sintering material. As can be deduced from FIG. 1, the drain terminal 7d of the IGBT chip 7 is connected flat and over the shortest path via the lower conductor layer 6 and the intermediate layer 16u to the metal inner layer 3i of the lower heat dissipation plate 3. The same is true analogously for the source terminal 7s, which likewise is connected over the shortest path to a portion of the metal inner layer 2i. In this way, the high currents flowing via source and drain can be introduced directly into the thick copper layers of the heat dissipation plates without having to flow via lines having higher self-inductance, and the heat generated in the IGBT chip is also removed over the shortest path via the heat dissipation plates 2 and 3. The high thermal conductivity (typically 150 to 250 W/mK) and the high mechanical strength of the connection formed from silver sintering material are favourable.

Other terminals of embedded components, via which high currents do not have to flow, can be connected to conductor structures of the upper and lower conductor layer 5 and 6 respectively via corresponding contacts and as is known can be guided out laterally from these layers 5 and 6 via conductive tracks. In this example, this concerns the gate terminal 7g of the IGBT 7 and the terminals of the IGBT driver 71. However, this does not mean that in principle only high-current lines can be guided out from the module via the inner layers 2i, 3i made of copper. Where applicable, this may also be the case for control lines or other lines.

Figure 2:
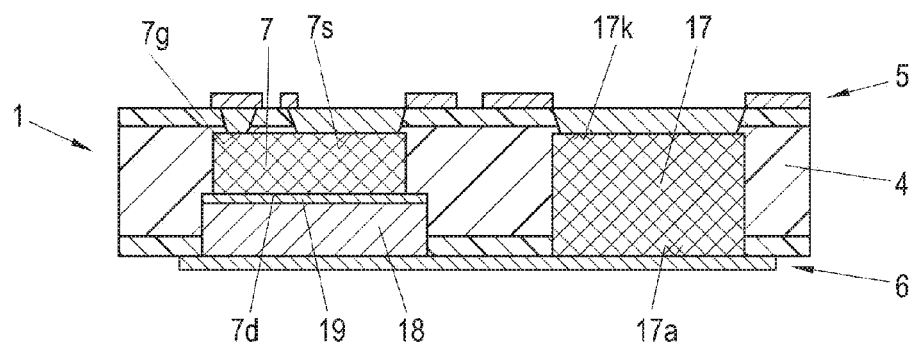
FIG. 2 shows a section through a printed circuit board core of a second embodiment.

FIG. 2, in which the same reference signs as in FIG. 1 are used for like or comparable parts, shows another example for the structure of a printed circuit board core 1. In this case, apart from an IGBT chip 7, a power diode 17 is also embedded in the prepreg insulating layer 4. The thickness of commercially available IGBTs is currently typically 70 to 150 µm, however that of diodes is typically 300 µm. It is also sought to use diodes having approximately the same thickness as IGBTs, however, if this is not possible, a thickness compensation must be created. One possibility for this is shown in FIG. 2, in which a metal block 18, here made of copper, is conductively connected by means of a metal intermediate layer 18, here a silver sintering paste 19, to the IGBT chip 7 and therefore the thickness of the IGBT chip together with copper block is matched to the thickness of the diode. It can be seen from FIG. 2 that, once the heat dissipation plates (not shown here) have been applied, the two terminals of the power diode 17, specifically their anode terminal 17a and their cathode terminal 17k, can also be connected over the shortest path to the conductive inner layers of the heat dissipation plates, as is shown in FIG. 1 in conjunction with the power terminals of the IGBT chip 7. The copper block 18 is used here primarily for adaptation to the different thicknesses of the components, however it also offers the advantage, on account of its high thermal capacity, that any lost heat produced in a pulse-like manner, for example in the event of a short circuit, can be quickly intercepted and temporarily stored.

Figure 3:
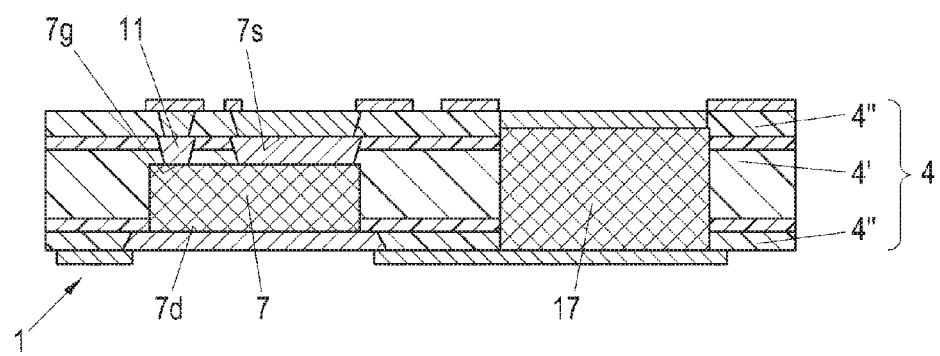
FIG. 3 shows a section through a printed circuit board core of a third embodiment.

Another possibility for compensating for the different thicknesses of components will be explained hereinafter on the basis of FIG. 3. Here, two lamination steps are performed: firstly, the thinner component, here the IGBT chip 7, is fixed in the middle of the core 1 and the electrical connections are produced by copper plating. The second lamination step is then performed, in which openings are produced by laser cutting in order to enable a thick copper layer to be applied to the upper side and underside of the power components. The first insulating layer 4', with the second insulating layers 4" produced in the second lamination step, forms the overall insulating layer 4. Particularly at the connections to the gate terminal 7g and to the source terminal 7s, the two-stage construction of the contacts 11 can be clearly seen. This thicker component, here again a power diode 17, can then also be embedded in the printed circuit board core 1. It is important that the thinner component—the IGBT chip 7—is brought into the middle of the core 1 in order to keep the depth of the cavities minimal in view of the copper plating and thus to avoid complicating the connection process with the heat dissipation plates 2, 3 as a result of cavities that are too deep. The two-stage lamination, in view of the height difference, would appear to be necessary only on the upper side, however it is recommended to perform a second lamination on the underside as well in order to maintain a broad symmetry.

Figure 4:
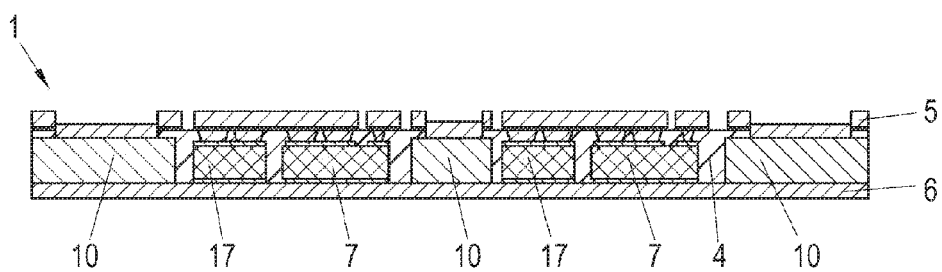
FIG. 4 shows a section through a printed circuit board core of a fourth embodiment.

FIG. 4 presents a further variant of a printed circuit board core 1, in which two IGBT chips 7 and two power diodes 17 for a half-bridge circuit are embedded in the insulating layer 4. In addition, three copper inlays 10 are provided in order to improve the thermal properties. The construction to form a finished power module corresponding analogously to that according to FIG. 1 is then implemented by the application of insulating material 13 where necessary (see FIG. 1) and connection of the upper and lower conductor layers to the metal inner layers 2i, 3i of the heat dissipation plates 2, 3. As in FIG. 1, an IGBT driver, such as the driver 71 in FIG. 1, can also be embedded here in the printed circuit board core 1.

A preferred method for producing a power module according to the invention will now be explained on the basis of FIG. 5 in individual key steps.

In FIG. 5a a power semiconductor 20, for example an IGBT chip, can be seen, of which the terminals have an upper and a lower copper metallisation 21o and 21u. The power semiconductor 20 is placed together with two copper inlays 10 onto a self-adhesive carrier film, which is indicated by two arrows. In accordance with FIG. 5b a prepreg layer 23 having cutouts 24 taking into account the power semiconductor 20 and the copper inlays 10 is now applied to this structure, and thereabove there is applied a further prepreg layer 25 having an upper copper film 26. A drilling or laser machining is then performed in order to produce cutouts in the copper film 26 and in the prepreg layer 23, of which the result is illustrated in FIG. 5c.

A galvanic contacting with copper and a reinforcement of the copper film 26 are then performed next, such that, as can be seen in FIG. 5d, contacts 27 to the power semiconductor 20 and the copper inlays 10 are then produced. Prior to the galvanic contacting, the carrier film 22 can be removed, if, for example in accordance with FIGS. 1 to 4, a 2-sided copper plating is desired. The upper reinforced conductor layer is now provided with the reference sign 5, since it corresponds to the upper conductor layer 5 in FIGS. 1 to 4. In a next step this conductor layer 5 is structured, wherein the carrier film 22 is removed beforehand or thereafter. A finished printed circuit board core 1 is then provided, wherein the lower copper metallisation 21u together with the lower surfaces of the copper inlays 10 corresponds to the lower conductor layer 6 in FIGS. 1 to 4 and are designated accordingly.

As shown in FIG. 5f, the assembly to form the power module is performed in a next step by joining on an upper and a lower heat dissipation plate 2 and 3. As has already been explained further above, each heat dissipation plate 2, 3 consists of a metal outer layer 2a, 3a made of aluminium, of an insulating intermediate layer 2z, 3z, and a metal structured inner layer 2i, 3i made of copper. The sintering is performed under application of pressure and heat and with use of a silver sintering paste 16o, 16u corresponding to the metal intermediate layers 16o and 16u in FIG. 1. The finished power module corresponding to FIG. 5g is obtained as a result.

Figure 5:
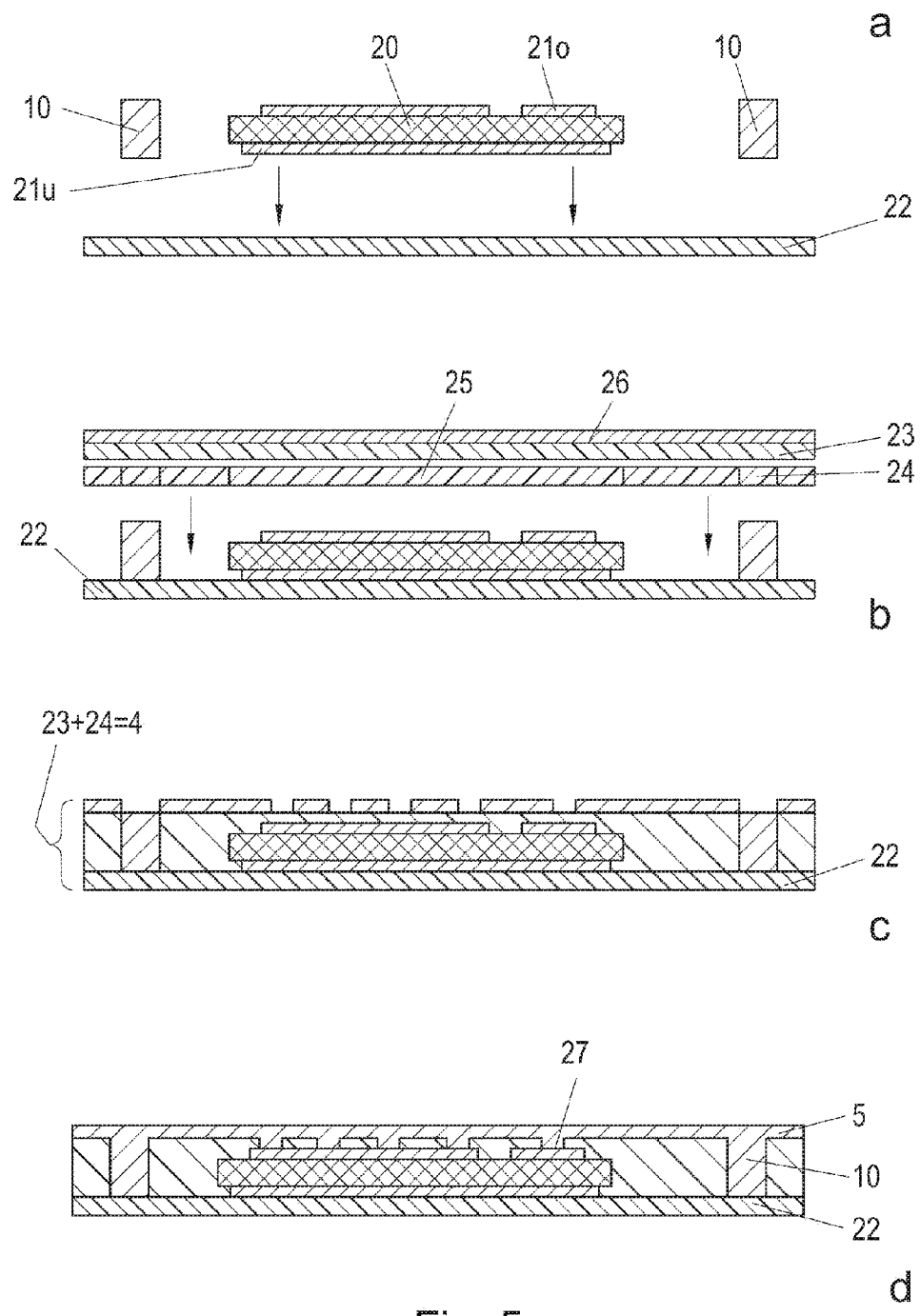
FIG. 5a to g show individual steps of a preferred method for producing a power module according to the invention.
Figure 5:
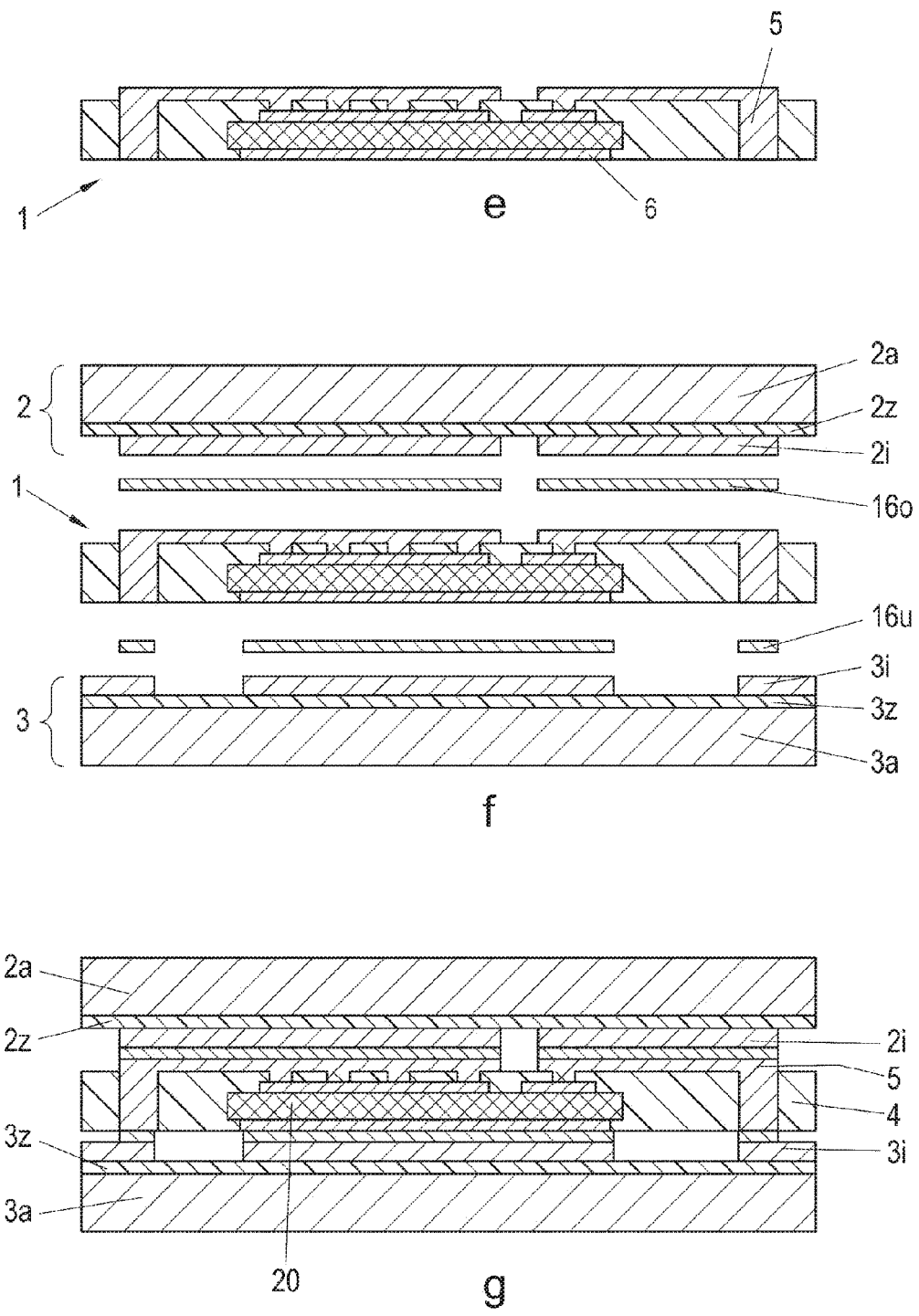

Only a single embedded component is shown in FIG. 5, however it should be clear that a number of power components and other component parts, such as driver chips, etc., can be embedded in accordance with the presented method and then are contained in the finished module.

Figure 6:
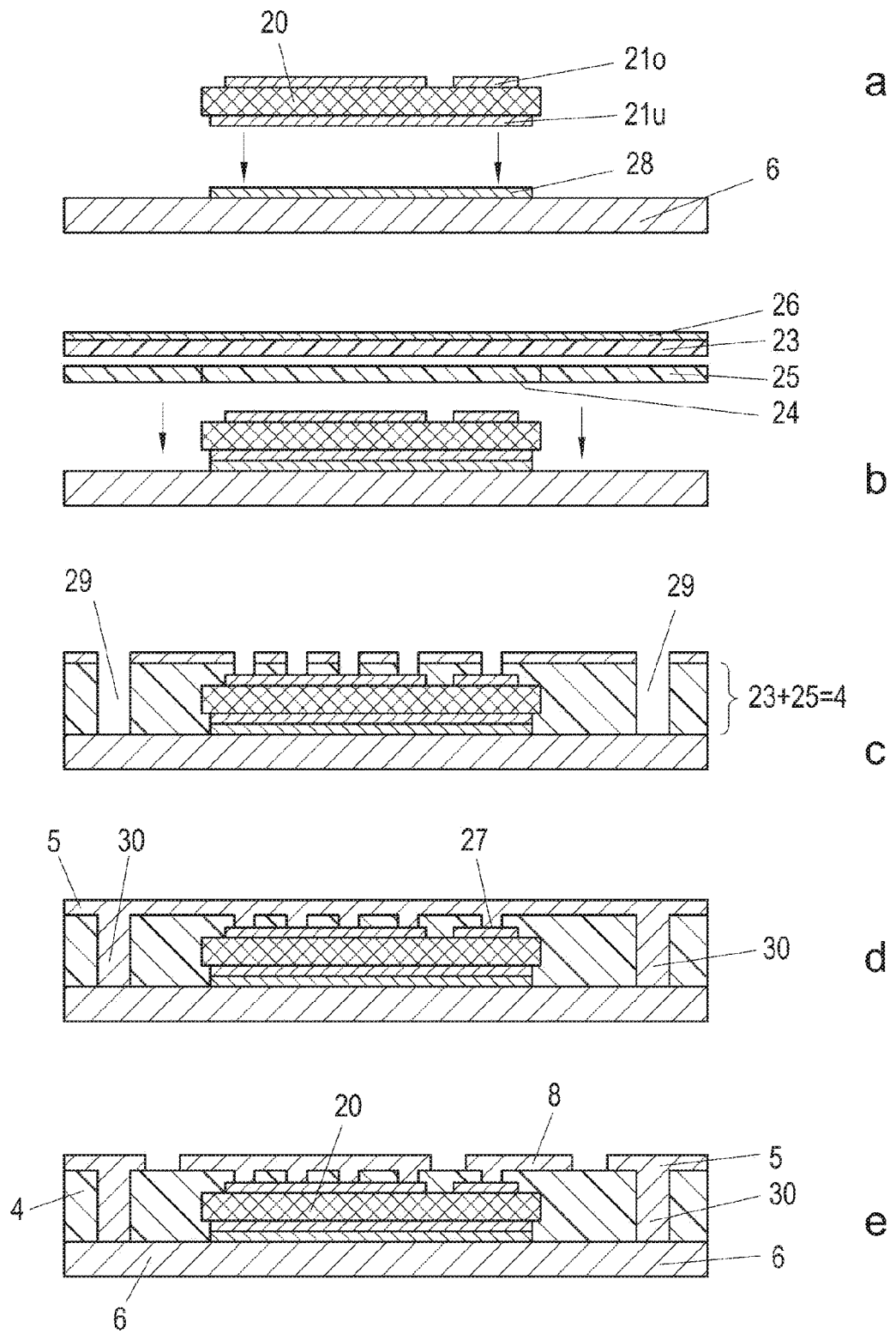
FIG. 6a to e show individual steps of another preferred method for producing a printed circuit board core for a power module according to the invention

The variant of a production method described on the basis of FIG. 6 is largely similar to the previously described method, however, in order to improve the heat dissipation of the power semiconductor 20 having the upper and lower copper metallisations 21o and 21u, the underside thereof is applied here to a copper carrier as lower conductor layer 6, to which a silver sintering paste 28 has been applied beforehand (FIG. 6a). To this there is applied, in the case of the previously described method, a prepreg layer 23 having a cutout 24 for the power semiconductor 20 and thereto a further prepreg layer 25 having an upper copper film 26. It should be mentioned that in the case of this method and also the previously described method the number of prepreg layers may vary depending on the component part thickness and/or availability of the prepreg thicknesses.

After the lamination step, there is performed in the following step in accordance with the illustration in FIG. 6c a drilling or laser machining in order to produce cutouts in the copper film 26 and in the prepreg layers 23 and 25, wherein in this case, in contrast to the previously described method, two cutouts 29 reaching as far as the lower conductor layer 6 are also produced.

A galvanic contacting with copper to the upper terminals of the power semiconductor 20 is then performed, and plated through-holes 30 from the upper copper film 26 to the lower conductor layer 6 are also produced galvanically.

Here as well, the copper film 26 is galvanically reinforced, wherein the upper reinforced conductor layer is now provided with the reference sign 5, since it corresponds to the upper conductor layer 5 in FIGS. 1 to 4 (FIG. 6d). This conductor layer 5 is then structured, such that conductive tracks 8 are created, and a finished printed circuit board core 1 is in turn provided (FIG. 6e), which then, in accordance with FIGS. 5f and 5g analogously, is assembled to form a power module by joining on an upper and lower heat dissipation plate.

The invention claimed is:

1. A power module, comprising a printed circuit board core, that contains at least one electronic power component embedded in an insulating layer, the core being arranged between two heat dissipation plates, each heat dissipation plate has a metal exterior layer and a metal interior layer that is electrically isolated from the metal exterior layer by a heat conducting, electrically insulating intermediate layer, and electrode connections of the at least one power component being guided out of the core via connecting lines
    characterized in that
        the printed circuit board core has a conductor layer on both sides of the insulating layer, at least one conductor layer is structured at least in sections and each conductor layer is connected, at least in sections, to a metal interior layer of the heat dissipation plate via a conducting, metal intermediate coating, contacts run from the structured conductor layer to the electrode connections of the at least one power component, and at least one power connection of the at least one power component is connected to at least one section of the metal interior layer of the heat dissipation plate, which forms part of the connecting line to the electrode connection, via a contact, a section of a structured conductor layer, and the conducting, metal intermediate coating, at least the metal interior layers of the heat dissipation plates being made of copper and the insulating layer of the printed circuit board core and insulating material for filling or covering intermediate spaces of the conductor structures being made of the same insulating material.

2. The power module according to claim 1, characterized in that at least one connection of a power component is connected to the metal interior layer of a heat dissipation plate via a conductor layer and a conducting metal intermediate layer.

3. The power module according to claim 1, characterized in that at least one connection of a power component is connected to a conductor layer via a current- and heat-conducting metal block.

4. The power module according to claim 3, characterized in that a connection is connected to a conductor layer via a metal intermediate layer.

5. The power module according to claim 1, characterized in that the metal intermediate layers are made of a low-temperature silver sinter material.

6. The power module according to claim 1, characterized in that the printed circuit board core comprises at least one metal block, which is in thermal and/or electrical connection at least with sections of the upper and lower conductor layers.

7. The power module according to claim 6, characterized in that the at least one metal block is made of copper.

8. The power module according to claim 1, characterized by comprising at least one IGBT chip/MOSFET, the source and drain terminals of which are connected to the metal interior layer, while the gate terminal is guided out off the module via a conductor track.

9. The power module according to claim 1, characterized by comprising at least one power diode, the cathode and/or anode of which are connected to the metal interior layer.

* * * * *